United States Patent
Yoon et al.

(10) Patent No.: US 11,923,404 B2
(45) Date of Patent: Mar. 5, 2024

(54) MODIFYING FERROELECTRIC PROPERTIES OF HAFNIUM OXIDE WITH HAFNIUM NITRIDE LAYERS

(71) Applicant: LAM RESEARCH CORPORATION, Fremont, CA (US)

(72) Inventors: Hyungsuk Alexander Yoon, San Jose, CA (US); Zhongwei Zhu, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 655 days.

(21) Appl. No.: 17/042,306

(22) PCT Filed: Mar. 26, 2019

(86) PCT No.: PCT/US2019/023987
§ 371 (c)(1),
(2) Date: Sep. 28, 2020

(87) PCT Pub. No.: WO2019/195024
PCT Pub. Date: Oct. 10, 2019

(65) Prior Publication Data
US 2021/0028273 A1     Jan. 28, 2021

Related U.S. Application Data (60) Provisional application No. 62/651,454, filed on Apr. 2, 2018.

(51) Int. Cl.
*C23C 16/34*      (2006.01)
*C23C 16/40*      (2006.01)
(Continued)

(52) U.S. Cl.
CPC .............. *H01L 28/60* (2013.01); *C23C 16/34* (2013.01); *C23C 16/405* (2013.01);
(Continued)

(58) Field of Classification Search
CPC .............. H01L 28/60; H01L 21/02181; H01L 21/02274; H01L 21/0228; H01L 21/02326;
(Continued)

(56) References Cited

U.S. PATENT DOCUMENTS

2006/0189154 A1   8/2006   Ahn et al.
2008/0057659 A1*  3/2008   Forbes .................... C23C 16/56
                                                       257/E29.151
(Continued)

FOREIGN PATENT DOCUMENTS

JP      6096902 B2       3/2017
WO   WO-2015141625 A1   9/2015

OTHER PUBLICATIONS

International Search Report and Written Opinion of the ISA issued in PCT/US2019/023987, dated Jul. 11, 2019; ISA/KR.
(Continued)

*Primary Examiner* — Mohammad A Rahman (57) ABSTRACT

A method of forming ferroelectric hafnium oxide ($HfO_2$) in a substrate processing system includes depositing an $HfO_2$ layer on a substrate, depositing a hafnium nitride (HfN) layer on the $HfO_2$ layer; and annealing the $HfO_2$ layer and the HfN layer to form ferroelectric hafnium $HfO_2$.

16 Claims, 5 Drawing Sheets

(51) Int. Cl.
*C23C 16/455* (2006.01)
*C23C 16/505* (2006.01)
*C23C 16/52* (2006.01)
*C23C 16/56* (2006.01)
*H01J 37/32* (2006.01)
*H01L 21/02* (2006.01)
*H01L 49/02* (2006.01)

(52) U.S. Cl.
CPC ...... *C23C 16/45536* (2013.01); *C23C 16/505* (2013.01); *C23C 16/52* (2013.01); *C23C 16/56* (2013.01); *H01J 37/32449* (2013.01); *H01L 21/0228* (2013.01); *H01L 21/02181* (2013.01); *H01L 21/02274* (2013.01); *H01L 21/02326* (2013.01); *H01L 21/02332* (2013.01); *H01J 2237/332* (2013.01)

(58) Field of Classification Search
CPC ............ H01L 21/02332; H01L 21/022; H01L 21/0234; H01L 28/75; H01L 29/6684; H01L 21/28556; H01L 21/324; H01L 21/67098; H01L 29/78391; H01L 2924/01072; H01L 29/66; H01L 29/78; H01L 21/28; H01L 21/02; H01L 21/285; H01L 21/67; C23C 16/34; C23C 16/405; C23C 16/45536; C23C 16/505; C23C 16/52; C23C 16/56; C23C 16/5096; C23C 16/455; H01J 37/32449; H01J 2237/332; H10B 53/00

See application file for complete search history.

(56) References Cited

U.S. PATENT DOCUMENTS

| | | |
|---|---|---|
| 2011/0189860 A1 | 8/2011 | Porshnev |
| 2014/0017403 A1 | 1/2014 | Chu et al. |
| 2015/0179935 A1* | 6/2015 | Hong .................. H10N 70/826 257/2 |
| 2016/0372478 A1 | 12/2016 | Ino et al. |
| 2017/0110335 A1* | 4/2017 | Yang ..................... H01J 37/321 |
| 2022/0189767 A1* | 6/2022 | Lei .................... H01L 21/02181 |

OTHER PUBLICATIONS

Decision for Grant of Patent from corresponding Korean Application No. 10-2020-7031548, dated Jan. 8, 2024.

* cited by examiner

MODIFYING FERROELECTRIC PROPERTIES OF HAFNIUM OXIDE WITH HAFNIUM NITRIDE LAYERS

CROSS-REFERENCE TO RELATED APPLICATIONS

This application is a U.S. National Phase Application under 35 U.S.C. 371 of International Application No. PCT/US2019/023987, filed on Mar. 26, 2019, which claims the benefit of U.S. Provisional Application No. 62/651,454, filed on Apr. 2, 2018. The entire disclosures of the applications referenced above are incorporated herein by reference.

FIELD

The present disclosure relates to methods for processing substrates, and more particularly to methods for reducing leakage current in hafnium oxide-based ferroelectric material.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The discovery of ferroelectric behavior in hafnium oxide ($HfO_2$)-based materials rejuvenated research into ferroelectric memory (FeRAM). Conventional ferroelectric materials such as lead zirconate titanate (PZT) do not have an adequate switching window for thicknesses below 50 nanometers (nm). Therefore PZT cannot be used for devices having features sizes that are less than 50 nm.

$HfO_2$ has excellent ferroelectric switching hysteresis down to thicknesses of 6 nm due to a high coercive field. $HfO_2$ is also a good candidate for 3D memory structures. $HfO_2$ has been widely used in CMOS technology as a gate dielectric. In these applications, $HfO_2$ is deposited using conformal atomic layer deposition (ALD). Therefore, $HfO_2$ may be suitable for integration into 3D FeRAM using the current 3D NAND integration schemes.

SUMMARY

A method of forming ferroelectric hafnium oxide ($HfO_2$) in a substrate processing system includes depositing an $HfO_2$ layer on a substrate, depositing a hafnium nitride (HfN) layer on the $HfO_2$ layer; and annealing the $HfO_2$ layer and the HfN layer to form ferroelectric hafnium $HfO_2$.

In other features, the method further includes depositing a second $HfO_2$ layer on the HfN layer. The method further includes performing oxidation on the HfN layer. Performing the oxidation on the HfN layer includes performing the oxidation using at least one of molecular oxygen and ozone. The method further includes nitridating the $HfO_2$ layer prior to depositing the HfN layer. Nitridating the $HfO_2$ layer includes generating plasma using a nitrogen gas species.

In other features, the method further includes depositing a top electrode on the HfN layer prior to the annealing. The top electrode comprises a material selected from a group consisting of titanium, tantalum, and tungsten. The method further includes depositing a second $HfO_2$ layer on the HfN layer and depositing a top electrode on the HfN layer. The method further includes depositing a bottom electrode on the substrate and depositing the $HfO_2$ layer on the bottom electrode. The $HfO_2$ layer is doped using a dopant species selected from a group consisting of silicon (Si), aluminum (Al), yttrium (Y), zirconium (Zr), and/or lanthanum (La). Annealing the $HfO_2$ layer and the HfN layer includes performing a rapid thermal annealing process at a temperature between 500 and 1100° C.

A system configured to form ferroelectric hafnium oxide ($HfO_2$) on a substrate in a processing chamber includes a gas delivery system configured to supply gases to the processing chamber and a radio frequency (RF) generating system configured to generate plasma within the processing chamber. A controller is configured to, by controlling the gas delivery system and the RF generating system, deposit an $HfO_2$ layer on the substrate, deposit a hafnium nitride (HfN) layer on the $HfO_2$ layer, and anneal the $HfO_2$ layer and the HfN layer to form ferroelectric hafnium $HfO_2$.

In other features, the controller is further configured to deposit a second $HfO_2$ layer on the HfN layer. The controller is further configured to perform oxidation on the HfN layer. Performing the oxidation on the HfN layer includes performing the oxidation using at least one of molecular oxygen and ozone. The controller is further configured to nitridate the $HfO_2$ layer prior to depositing the HfN layer. Nitridating the $HfO_2$ layer includes generating plasma using a nitrogen gas species.

In other features, the controller is further configured to deposit a top electrode on the HfN layer prior to the annealing. The top electrode comprises a material selected from a group consisting of titanium, tantalum, and tungsten. The controller is further configured to deposit a second $HfO_2$ layer on the HfN layer and deposit a top electrode on the HfN layer. The controller is further configured to deposit a bottom electrode on the substrate and deposit the $HfO_2$ layer on the bottom electrode. The $HfO_2$ layer is doped using a dopant species selected from a group consisting of silicon (Si), aluminum (Al), yttrium (Y), zirconium (Zr), and/or lanthanum (La). Annealing the $HfO_2$ layer and the HfN layer includes performing a rapid thermal annealing process at a temperature between 500 and 1100° C.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Thermal stability of $HfO_2$ is an obstacle for commercialization in FeRAM applications. Although temperatures of 600-650° C. are high enough to crystallize as-deposited amorphous $HfO_2$ into the ferroelectric phase, many integration schemes require a thermal budget of at least 1000° C. The higher process temperature degrades $HfO_2$-based FeRAM by increasing leakage current and/or shorting the devices. Sources of leakage after high temperature annealing include defect generation at a top electrode/$HfO_2$ interface. Another source of leakage current includes film cracking of $HfO_2$. With the cracking of $HfO_2$, atoms from the top and bottom electrodes (typically TiN) can freely diffuse into $HfO_2$, which eventually fails the device. For example, the top electrode functions as a cap during annealing to prevent transition of the $HfO_2$ layer into a thermodynamically stable monoclinic phase. In the monoclinic phase, $HfO_2$ is not ferroelectric.

In some examples, $HfO_2$ may be doped (i.e., a dopant may be added to the $HfO_2$). For example, a desired ferroelectricity of $HfO_2$ may be controlled by varying a type and concentration of the dopant. However, some types and concentrations of dopants may cause undesirable traits in the operation of a semiconductor device comprising the ferroelectric $HfO_2$. For example, increasing a mol % of silicon (Si) in ferroelectric $HfO_2$ (e.g., from 4% to 6%) may cause a "wake-up effect," which may correspond to an increase in remnant polarization of the $HfO_2$. In one example, using zirconium (Zr) as the dopant instead of Si causes an interdependence of polarization and the annealing temperature, which increases the susceptibility of the device to process variations and non-uniformities.

Systems and methods according to the present disclosure deposit one or more hafnium nitride (HfN) layers on the $HfO_2$ layer, between alternating $HfO_2$ layers, etc. to modify ferroelectric properties of the $HfO_2$ layer. For example, the HfN layer may be deposited using ALD in a same processing chamber used to deposit the $HfO_2$ layer.

Figure 1:
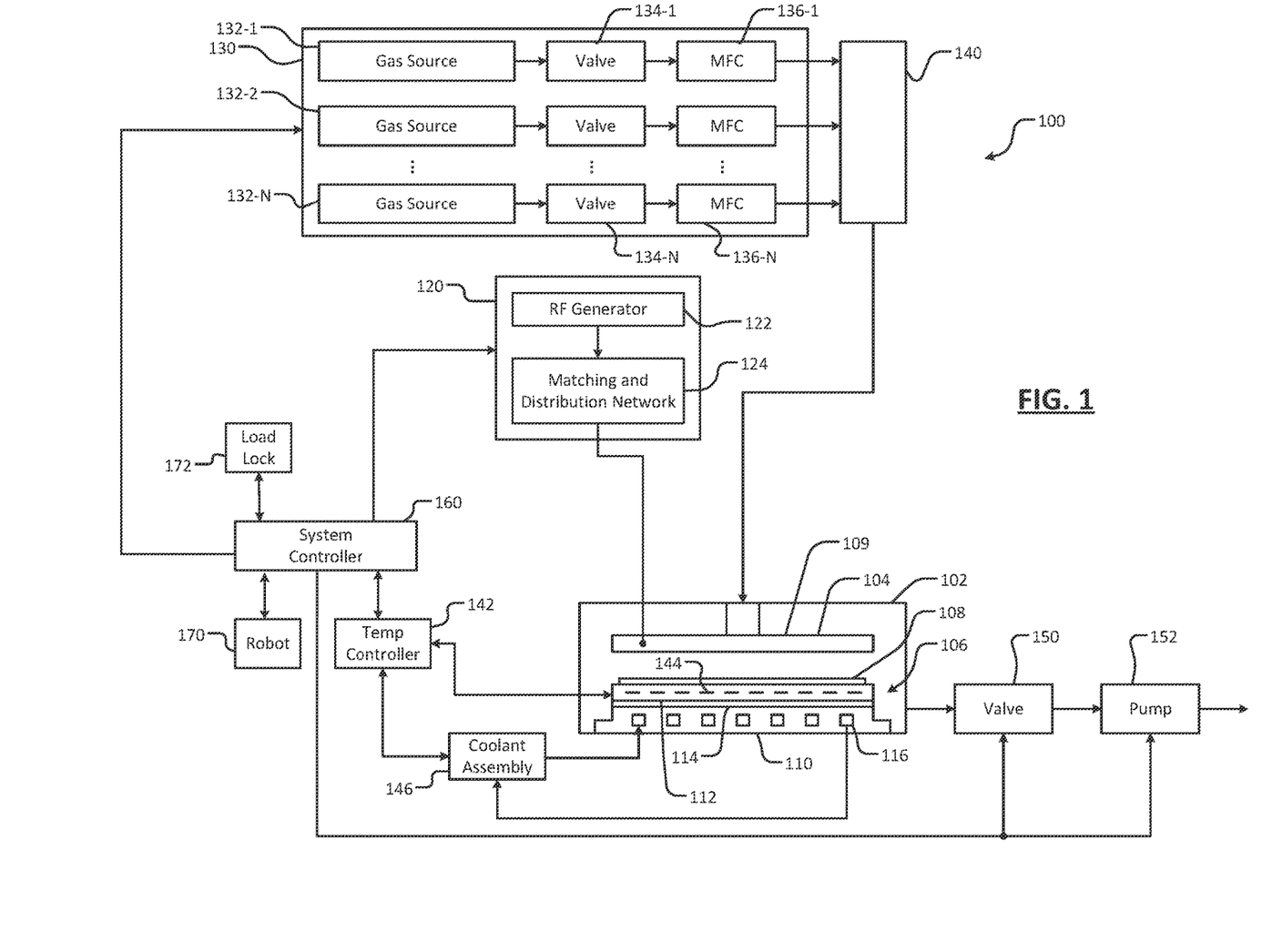
FIG. 1 is a functional block diagram of an example substrate processing system for forming a ferroelectric hafnium oxide ($HfO_2$) layer according to the present disclosure.

FIG. 1 shows an example substrate processing system 100 for depositing and doping an $HfO_2$ layer including one or more HfN layers using atomic layer deposition (ALD) to form ferroelectric $HfO_2$ according to the present disclosure. While the deposition and doping of the $HfO_2$ layer and the deposition of the HfN layer are performed in the same processing chamber in this example, separate processing chambers can be used. For example, a transformer coupled plasma (TCP) chamber, a plasma-enhanced chemical vapor deposition (PECVD) chamber, a high pressure CVD (HPCVD) chamber, and/or a processing chamber using a remote plasma source may be used to perform one or more deposition or etching steps described below.

The substrate processing system 100 includes a processing chamber 102 that encloses other components of the substrate processing system 100 and contains the RF plasma. The substrate processing chamber 102 includes an upper electrode 104 and a substrate support, such as an electrostatic chuck (ESC) 106. During operation, a substrate 108 is arranged on the ESC 106.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The ESC 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the ESC 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more deposition precursors and mixtures thereof. The gas precursors may include precursor gases for the $HfO_2$ layer, the HfN layer, and/or other layers. The gas sources may also supply purge gas and gases including a nitrogen species for plasma nitridation and/or other gas species (such as Ar, $Ar/H_2$, $NH_3$, $O_2$, $O_3$, etc.) for other plasma treatments. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 138. An output of the manifold 138 is fed to the processing chamber 102. For example only, the output of the manifold 138 is fed to the showerhead 109. In some examples, an optional ozone generator 140 may be provided between the mass flow controllers 136 and the manifold 138. In some examples, the substrate processing system 100 may include a liquid precursor delivery system 141. The liquid precursor delivery system 141 may be incorporated within the gas delivery system 130 as shown or may be external to the gas delivery system 130. The liquid precursor delivery system 141 is configured to provide precursors that are liquid and/or solid at room temperature via a bubbler, direct liquid injection, vapor draw, etc.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate as described in more detail in FIGS. 2A and 2B. The temperature controller 142 may be used to control the plurality of TCEs 144 to control a temperature of the ESC 106 and the substrate 108.

The temperature controller 142 may communicate with a coolant assembly 146 (e.g., including a coolant pump, coolant reservoir or source, etc.) to control coolant flow through the channels 116. The temperature controller 142 operates the coolant assembly 146 to selectively flow the coolant through the channels 116 to cool the ESC 106.

A valve 150 and pump 152 may be used to evacuate reactants from the processing chamber 102. A system controller 160 may be used to control components of the substrate processing system 100. A robot 170 may be used to deliver substrates onto, and remove substrates from, the ESC 106. For example, the robot 170 may transfer substrates between the ESC 106 and a load lock 172. Although shown as separate controllers, the temperature controller 142 may be implemented within the system controller 160.

Figure 2A:
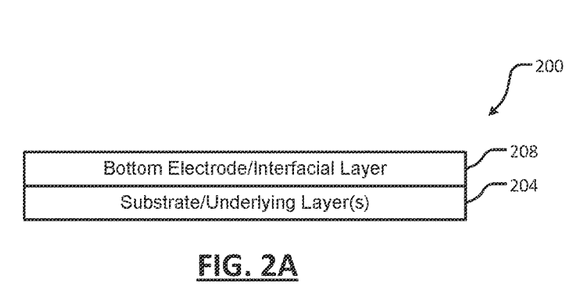
FIGS. 2A through 2F are side cross-sectional views of an example process for forming a device including ferroelectric $HfO_2$.

Referring now to FIGS. 2A, 2B, 2C, 2D, 2E, and 2F, an example process for forming a ($HfO_2$)-based ferroelectric material in a device 200 is shown. In FIG. 2A, the device 200 includes a substrate (e.g., one or more underlying layers) 204 and an interfacial layer 208 arranged on the underlying layers 204. For example, the underlying layers 204 comprise silicon (Si). In some examples, the interfacial layer 208 corresponds to a bottom electrode including titanium nitride (TiN), tantalum nitride (TaN), or tungsten (W), although other electrode materials can be used. Other examples include, but are not limited to, platinum (Pt), gold (Au), palladium (Pd), aluminum (Al), molybdenum (Mo), nickel (Ni), titanium (Ti), etc. In other examples, the interfacial layer 208 may include silicon dioxide ($SiO_2$) or silicon oxynitride (SiON). In some examples, the interfacial layer 208 is deposited using atomic layer deposition (ALD), chemical vapor deposition (CVD) or physical vapor deposition (PVD). In other examples, the interfacial layer 208 may be formed via thermal oxidation of Si. For example, the interfacial layer 208 may be formed by thermal oxidation of Si in an oxygen environment with a nitrogen species (e.g., $N_2O$ or $N_2$) to form SiON, plasma nitridation of $SiO_2$, etc.

Figure 2B:
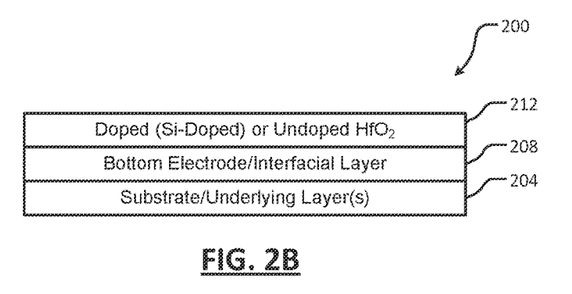

As shown in FIG. 2B, an $HfO_2$ layer 212 is deposited on the interfacial layer 208. In some examples, the deposited $HfO_2$ layer 212 has a thickness in a range from 2 nm to 12 nm. In some examples, the $HfO_2$ layer 212 is doped using a dopant species selected from a group consisting of silicon (Si), aluminum (Al), yttrium (Y), zirconium (Zr), and/or lanthanum (La). In some examples, the $HfO_2$ layer 212 is deposited using atomic layer deposition (ALD), although other processes can be used. For example, thermal ALD or plasma-enhanced ALD can be used. In some examples, the $HfO_2$ layer 212 is undoped. In other examples, the $HfO_2$ layer 212 is doped to a predetermined doping level from greater than 0 mol % to less than or equal to 60 mol % of the selected dopant species. In some examples, the $HfO_2$ layer 212 is doped to a predetermined doping level from 3 mol % to 5 mol % of the selected dopant species. The $HfO_2$ layer 212 may be amorphous.

Plasma treatment of the $HfO_2$ layer 212 may optionally be performed. For example, the $HfO_2$ layer 212 is nitrated by plasma including a nitrogen gas species. For example, molecular nitrogen ($N_2$) gas may be used. In some examples, the nitridation is performed during a predetermined period in a range from 15 s to 60 s. In some examples, the RF power may be in a range from 100 W to 15 kW. In some examples, the plasma power is in a range from 500 W to 1200 W. In some examples, the RF frequency may be in a range from 1 MHz to 15 MHz. In some examples, the RF frequency is 2.0 MHz and/or 13.56 MHz.

Figure 2C:
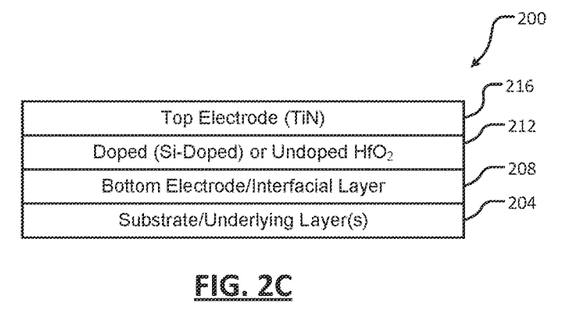

After plasma treatment, a top electrode 216 is deposited on the $HfO_2$ layer 212 as shown in FIG. 2C. In some examples, the top electrode 216 includes TiN, TaN or W, although other electrode materials can be used (e.g., Pt, Au, Pd, Al, Mo, Ni, Ti, etc.). In some examples, the top electrode 216 is deposited using atomic layer deposition (ALD), chemical vapor deposition (CVD), or physical vapor deposition (PVD). After depositing the top electrode 216, the device 200 is annealed at a predetermined temperature in a range from 500° C. to 1100° C. In other examples, the annealing temperature is in a range from 800° C. to 1000° C.

Figure 2D:
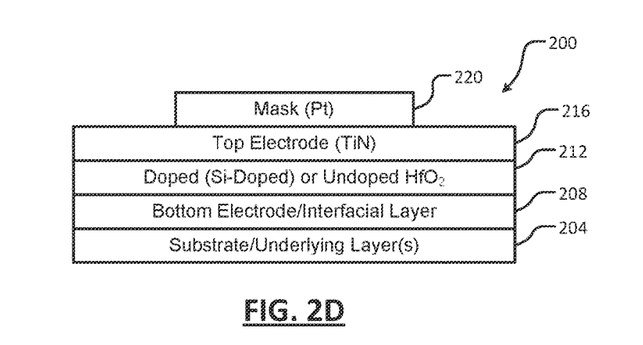
Figure 2E:
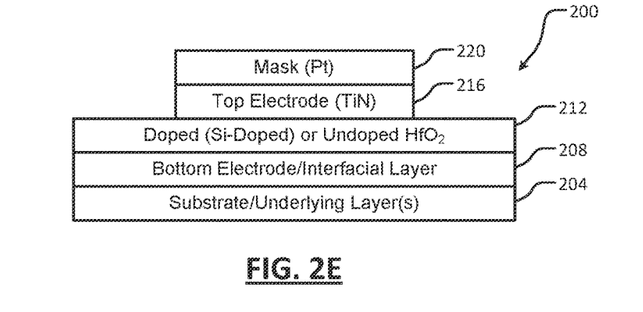
Figure 2F:
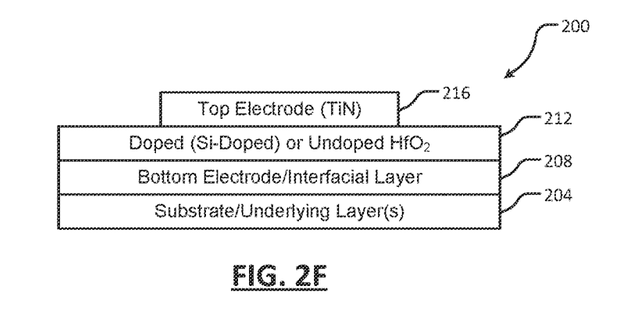

After annealing, the top electrode 216 is patterned as shown in FIGS. 2D, 2E, and 2F. For example, a mask 220 may be deposited as shown in FIG. 2D. The mask 220 may comprise platinum (Pt). The top electrode 216 is etched using wet etching or dry etching as shown in FIG. 2E. In some examples, the mask 220 is optionally removed after etching as shown in FIG. 2F. In other examples, the mask is not removed.

Figure 3A:
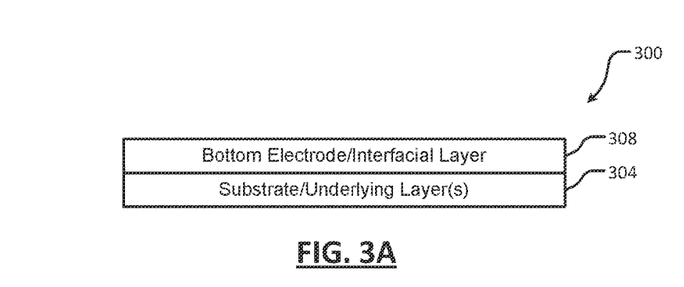
FIGS. 3A through 3F are side cross-sectional views of an example process for forming a ferroelectric $HfO_2$ layer including hafnium nitride (HfN) according to the present disclosure.

Referring now to FIGS. 3A, 3B, 3C, 3D, 3E, and 3F, an example process for forming a ($HfO_2$)-based ferroelectric layer including HfN in a device 300 according to the present disclosure is shown. In FIG. 3A, the device 300 includes a substrate (e.g., one or more underlying layers) 304 and an interfacial layer 308 arranged on the underlying layers 304. For example, the underlying layers 304 comprise silicon (Si). In some examples, the interfacial layer 308 corresponds to a bottom electrode including titanium nitride (TiN), tantalum nitride (TaN), or tungsten (W), although other electrode materials can be used. Other examples include, but are not limited to, platinum (Pt), gold (Au), palladium (Pd), aluminum (Al), molybdenum (Mo), nickel (Ni), titanium (Ti), etc. In other examples, the interfacial layer 308 may include silicon dioxide ($SiO_2$) or silicon oxynitride (SiON). In some examples, the interfacial layer 308 is deposited using atomic layer deposition (ALD), chemical vapor deposition (CVD) or physical vapor deposition (PVD).

Figure 3B:
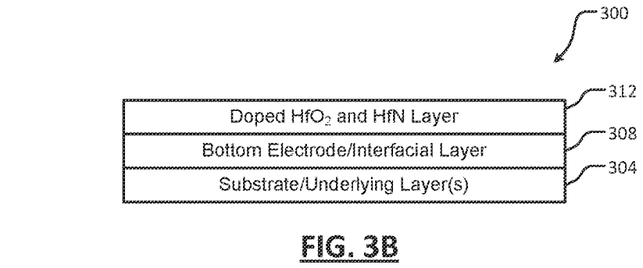

As shown in FIG. 3B, an $HfO_2$ layer (e.g., a ferroelectric layer) 312 including one or more layers of $HfO_2$ and one or more layers of HfN is deposited on the interfacial layer 308. The $HfO_2$ layer 312 and the one or more layers of HfN may be deposited using atomic layer deposition (ALD), although other processes can be used. For example, thermal ALD or plasma-enhanced ALD can be used. The $HfO_2$ layer 312 may be amorphous. In some examples, a top layer of the $HfO_2$ layer 312 may be an HfN layer. In other examples, an HfN layer may be arranged between adjacent $HfO_2$ layers. In some examples, the deposited $HfO_2$ layer 312 including the one or more HfN layers has a thickness in a range from 2 nm to 12 nm.

In some examples, the $HfO_2$ layer 312 is doped using a dopant species selected from a group consisting of silicon (Si), aluminum (Al), yttrium (Y), zirconium (Zr), gadolinium (Gd), strontium (Sr), and/or lanthanum (La). For example, the $HfO_2$ layer 312 is doped to a predetermined doping level from greater than 0 mol % to less than or equal to 60 mol % of the selected dopant species. In some examples, the $HfO_2$ layer 312 is doped to a predetermined doping level from 3 mol % to 5 mol % of the selected dopant species. In other examples, the $HfO_2$ layer 312 may be undoped.

Plasma treatment of the $HfO_2$ layer 312 may optionally be performed. For example, the $HfO_2$ layer 312 is nitridated by plasma including a nitrogen gas species. For example, molecular nitrogen ($N_2$) gas may be used. In some examples, the nitridation is performed during a predetermined period in a range from 15 s to 60 s. In some examples, the RF power may be in a range from 100 W to 15 kW. In some examples, the plasma power is in a range from 500 W to 1200 W. In some examples, the RF frequency may be in a range from 1 MHz to 15 MHz. In some examples, the RF frequency is 2.0 MHz and/or 13.56 MHz. In other examples, the $HfO_2$ layer 312 may be treated with a plasma including an oxygen gas species such as molecular oxygen ($O_2$) or ozone ($O_3$) to modify properties of the HfN.

Figure 3C:
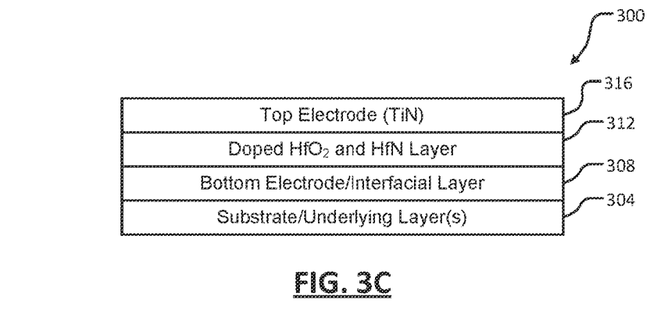

After plasma treatment, a top electrode 316 is deposited on the $HfO_2$ layer 312 as shown in FIG. 3C. In some examples, the top electrode 316 includes TiN, TaN or W, although other electrode materials can be used (e.g., Pt, Au, Pd, Al, Mo, Ni, Ti, etc.). In some examples, the top electrode 316 is deposited using atomic layer deposition (ALD), chemical vapor deposition (CVD), or physical vapor deposition (PVD). After depositing the top electrode 316, the device 300 is annealed at a predetermined temperature in a range from 500° C. to 1100° C. In other examples, the annealing temperature is in a range from 800° C. to 1000° C.

Figure 3D:
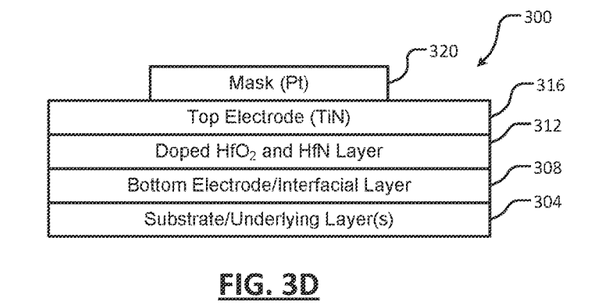
Figure 3E:
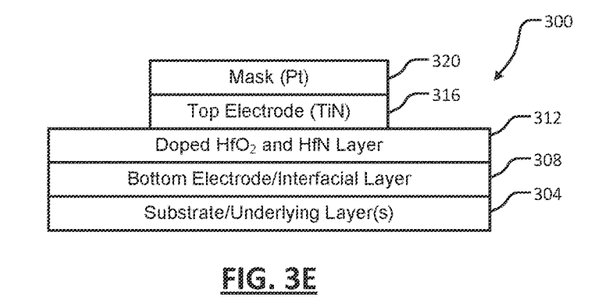
Figure 3F:
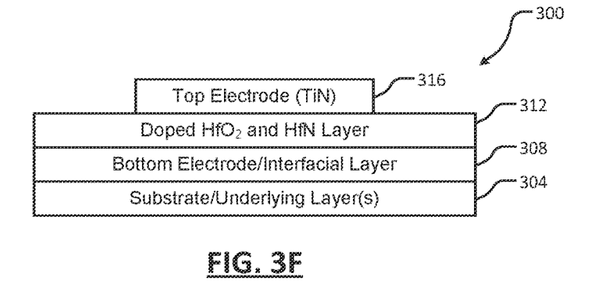

After annealing, the top electrode 216 is patterned as shown in FIGS. 3D, 3E, and 3F. For example, a mask 320 may be deposited as shown in FIG. 3D. The mask 320 may be patterned using lift-off, shadow masking, or other suitable patterning methods. The mask 320 may comprise platinum (Pt) or another inert metal. The top electrode 316 is etched using wet etching or dry etching as shown in FIG. 3E. In some examples, the mask 320 is optionally removed after etching (e.g., using wet or dry etching) as shown in FIG. 3F. In other examples, the mask is not removed.

Figure 4A:
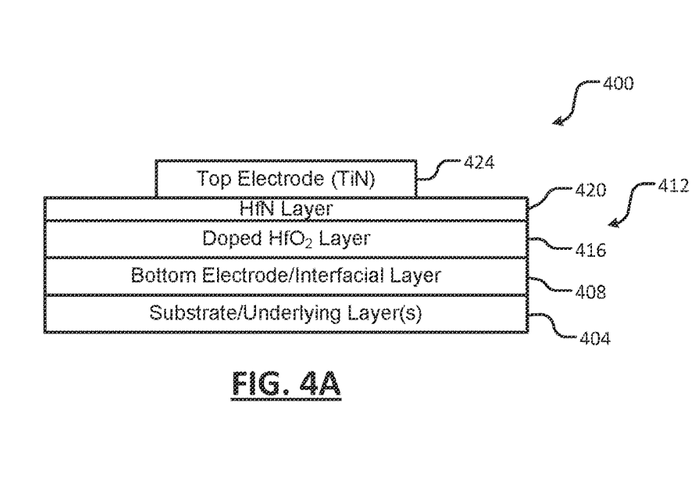
FIGS. 4A and 4B are side cross-sectional views of an example device including an HfN layer formed on an $HfO_2$ layer according to the present disclosure.
Figure 4B:
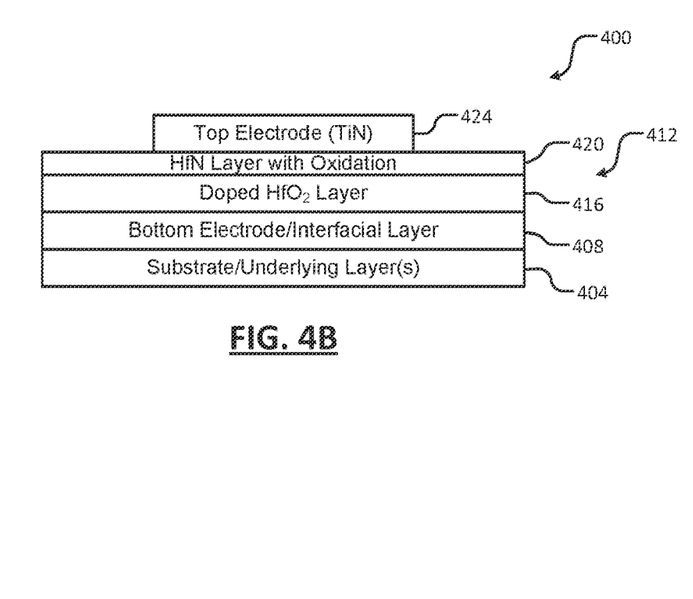

Referring now to FIGS. 4A and 4B, an example device 400 formed according to the present disclosure is shown. The device 400 includes a substrate (e.g., one or more underlying layers) 404 and an interfacial layer 408 arranged on the underlying layers 404. A ferroelectric layer 412 including a $HfO_2$ layer 416 and an HfN layer 420 is formed on the interfacial layer 408. A top electrode 424 is formed on the ferroelectric layer 412. In some examples, the $HfO_2$ layer 416 is doped (e.g., with Si, Al, Yt, Zr, La, Gd, Sr, etc.). As shown in FIGS. 4A and 4B, the HfN layer 420 is a top (i.e., upper surface) layer of the ferroelectric layer 412.

The $HfO_2$ layer 416 and the HfN layer 420 may be deposited using an ALD process. The ALD process may correspond to a thermal process using an ammonia ($NH_3$) co-reactant or a plasma process in an $NH_3$, $N_2$, or $N_2/H_2$ gas environment. In some examples (e.g., in examples where $NH_3$ is used as a co-reactant), the HfN layer 420 may include remnant hydrogen atoms. The remnant hydrogen atoms may cause defects during annealing, which may lead to high leakage current and low thermal stability. Accordingly, in some examples, the HfN layer 420 may be treated with plasma including an oxygen gas species such as molecular oxygen ($O_2$) or ozone ($O_3$) to reduce hydrogen content of the HfN layer 420. The oxidation partially oxidizes the HfN layer 420 to reduce hydrogen content in the HfN layer 420. In this manner, an increase in leakage current associated with the HfN layer 420 may be reduced or eliminated. For example, oxidation of the HfN layer may reduce the leakage current by a factor of 10 without changing remnant polarization. In the example shown in FIG. 4A, oxidation is not performed on the HfN layer 420. In the example shown in FIG. 4B, oxidation is performed on the HfN layer 420.

Figure 5A:
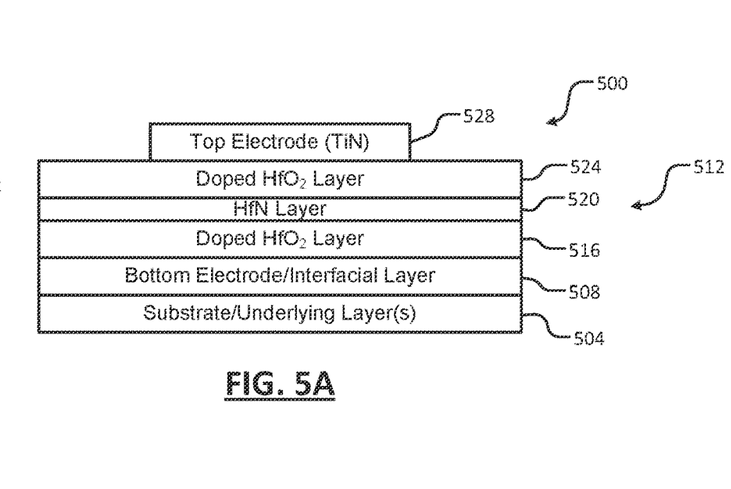
FIGS. 5A and 5B are side cross-sectional views of an example device including an HfN layer formed between $HfO_2$ layers according to the present disclosure.
Figure 5B:
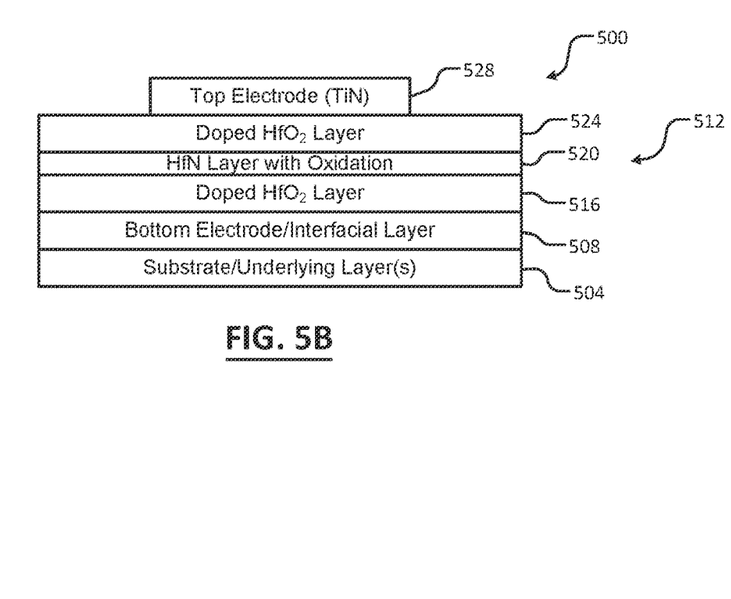

Referring now to FIGS. 5A and 5B, another example device 500 formed according to the present disclosure is shown. The device 500 includes a substrate (e.g., one or more underlying layers) 504 and an interfacial layer 508 arranged on the underlying layers 504. A ferroelectric layer 512 including a first $HfO_2$ layer 516, an HfN layer 520, and a second $HfO_2$ layer 524 is formed on the interfacial layer 508. A top electrode 528 is formed on the ferroelectric layer 512. In some examples, the $HfO_2$ layers 516 and 524 are doped (e.g., with Si, Al, Yt, Zr, La, Gd, Sr, etc.). As shown in FIGS. 5A and 5B, the HfN layer 420 is arranged between the $HfO_2$ layers 516 and 524. In other examples, a plurality of the HfN layers 420 may be deposited (e.g., alternating with adjacent $HfO_2$ layers). When the HfN layer 420 is deposited between the $HfO_2$ layers 516 and 524 as shown in FIGS. 5A and 5B, remnant polarization is increased (e.g., by 25%). In the example shown in FIG. 5A, oxidation is not performed on the HfN layer 520. In the example shown in FIG. 5B, oxidation is performed on the HfN layer 520 (e.g., as described above in FIG. 4B).

Figure 6:
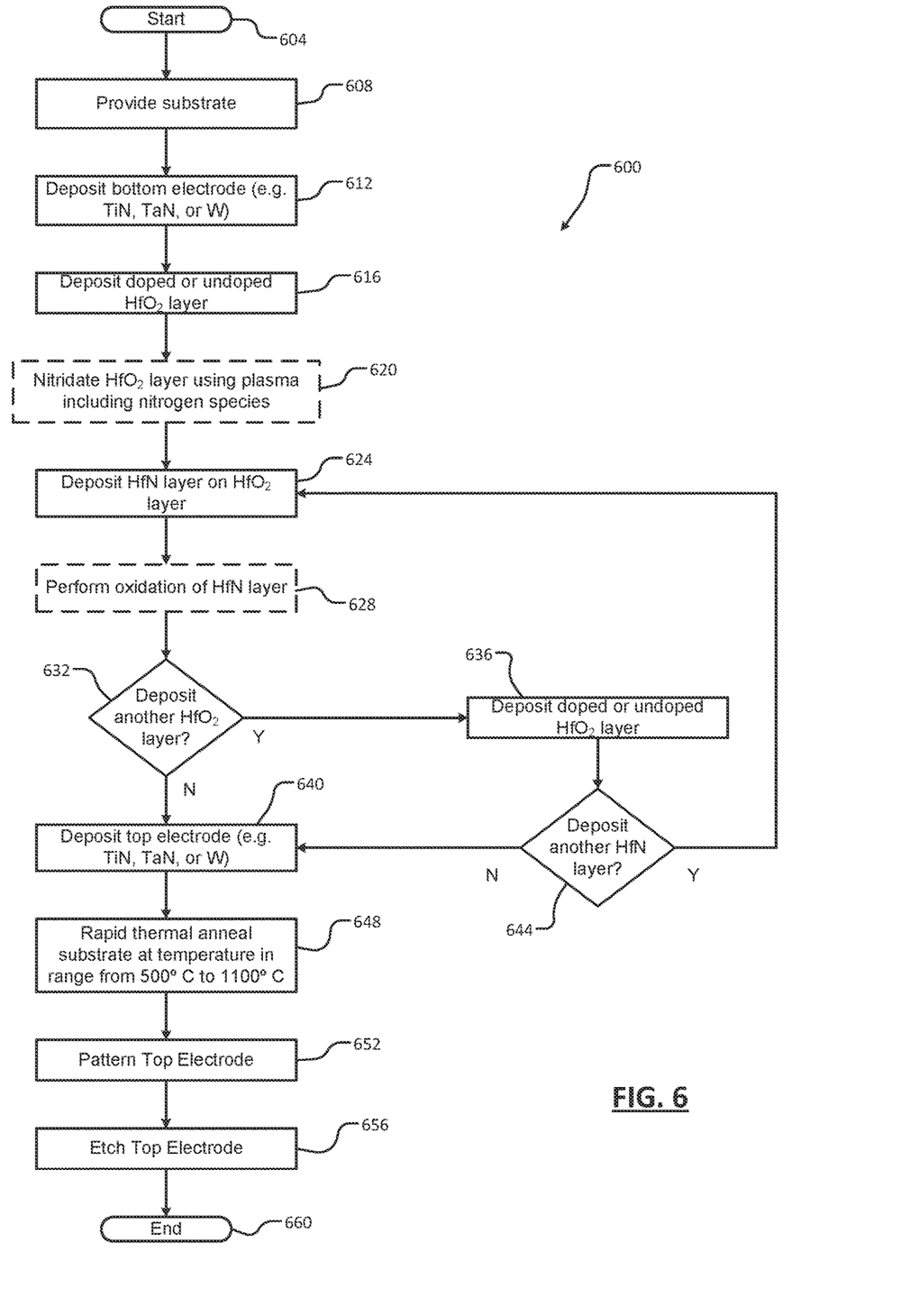
FIG. 6 illustrates an example method for forming a ferroelectric $HfO_2$ layer including an HfN layer according to the present disclosure.

Referring now to FIG. 6, an example method 600 for forming a ferroelectric $HfO_2$ layer including an HfN layer according to the present disclosure begins at 604. At 608, a substrate is provided. For example, a substrate including one or more underlying layers is arranged on a substrate support in a substrate processing chamber. At 612, an interfacial layer is deposited on the substrate. The interfacial layer may include silicon dioxide ($SiO_2$) or silicon oxynitride (SiON), and/or may correspond to a bottom electrode including titanium nitride (TiN), tantalum nitride (TaN), or tungsten (W). The interfacial layer may be deposited using atomic layer deposition (ALD), chemical vapor deposition (CVD), or physical vapor deposition (PVD). At 616, a doped or undoped $HfO_2$ layer is deposited on the interfacial layer (e.g., using ALD). At 620, plasma treatment of the $HfO_2$ layer may optionally be performed. For example, the $HfO_2$ layer may be nitridated by plasma including a nitrogen gas species.

At 624, an HfN layer is deposited on the $HfO_2$ layer. For example, the HfN layer may be deposited using atomic layer deposition (ALD). At 628, oxidation is optionally performed on the HfN layer. At 632, the method 600 determines whether to deposit another $HfO_2$ layer. If true, the method 600 continues to 636. If false, the method 600 continues to 640. At 636, an $HfO_2$ layer is deposited on the HfN layer and, optionally, treated with plasma. At 644, the method 600 determines whether to deposit another HfN layer. If true, the method 600 continues to 624. If false, the method 600 continues to 640.

At 640, a top electrode (e.g., TiN, TaN, or W) is deposited on the $HfO_2$ layer. For example, the top electrode is deposited using atomic layer deposition (ALD), chemical vapor deposition (CVD), or physical vapor deposition (PVD). At 648, the substrate, interfacial layer, $HfO_2$ layer, HfN layer, and top electrode and are annealed at a predetermined temperature in a range from 500° C. to 1100° C. (e.g., from 800° C. to 1000° C.) to form ferroelectric $HfO_2$. The top electrode may be patterned at 652 (e.g., a mask may be patterned onto the top electrode) and etched at 656. The method 600 ends at 660.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method of forming ferroelectric hafnium oxide ($HfO_2$) of a ferroelectric random access memory (FeRAM) memory structure, in a substrate processing system, the method comprising:
   depositing a first $HfO_2$ layer on a substrate;
   depositing a hafnium nitride (HfN) layer on the first $HfO_2$ layer;
   depositing a second $HfO_2$ layer on the HfN layer, the second $HfO_2$ layer having the same material as the first $HfO_2$ layer;
   depositing a top electrode on the second $HfO_2$ layer; and annealing the first HfO$_2$ layer, the second HfO$_2$ layer, the HfN layer, and the top electrode to form ferroelectric hafnium HfO$_2$ of the FeRAM memory structure, wherein annealing the first HfO$_2$ layer, the second HfO$_2$ layer, the HfN layer, and the top electrode includes performing a rapid thermal annealing process at a temperature between 750 and 1100° C.

2. The method of claim 1, further comprising performing oxidation on the HfN layer.

3. The method of claim 2, wherein performing the oxidation on the HfN layer includes performing the oxidation using at least one of molecular oxygen and ozone.

4. The method of claim 1, further comprising nitridating the first HfO$_2$ layer prior to depositing the HfN layer.

5. The method of claim 4, wherein nitridating the first HfO$_2$ layer includes generating plasma using a nitrogen gas species.

6. The method of claim 1, wherein the top electrode comprises a material selected from a group consisting of titanium, tantalum, and tungsten.

7. The method of claim 1, further comprising depositing a bottom electrode on the substrate and depositing the first HfO$_2$ layer on the bottom electrode.

8. The method of claim 1, wherein the first HfO$_2$ layer is doped using a dopant species selected from a group consisting of silicon (Si), aluminum (Al), yttrium (Y), zirconium (Zr), and/or lanthanum (La).

9. A system configured to form ferroelectric hafnium oxide (HfO$_2$) on a substrate of a ferroelectric random access memory (Fe RAM) memory structure, in a processing chamber, the system comprising:
  a gas delivery system configured to supply gases to the processing chamber;
  a radio frequency (RF) generating system configured to generate plasma within the processing chamber; and
  a controller configured to, by controlling the gas delivery system and the RF generating system,
    deposit a first HfO$_2$ layer on the substrate,
    deposit a hafnium nitride (HfN) layer on the first HfO$_2$ layer,
    deposit a second HfO$_2$ layer on the HfN layer, the second HfO$_2$ layer having the same material as the first HfO$_2$ layer,
    deposit a top electrode on the second HfO$_2$ layer; and
    anneal the first HfO$_2$ layer, the second HfO$_2$ layer, the HfN layer, and the top electrode to form ferroelectric hafnium HfO$_2$ of the Fe RAM memory structure,
  wherein annealing the first HfO$_2$ layer, the second HfO$_2$ layer, the HfN layer, and the top electrode to form ferroelectric hafnium HfO$_2$ includes performing a rapid thermal annealing process at a temperature between 750 and 1100° C.

10. The system of claim 9, wherein the controller is further configured to perform oxidation on the HfN layer.

11. The system of claim 10, wherein performing the oxidation on the HfN layer includes performing the oxidation using at least one of molecular oxygen and ozone.

12. The system of claim 9, wherein the controller is further configured to nitridate the first HfO$_2$ layer prior to depositing the HfN layer.

13. The system of claim 12, wherein nitridating the first HfO$_2$ layer includes generating plasma using a nitrogen gas species.

14. The system of claim 9, wherein the top electrode comprises a material selected from a group consisting of titanium, tantalum, and tungsten.

15. The system of claim 9, wherein the controller is further configured to deposit a bottom electrode on the substrate and deposit the first HfO$_2$ layer on the bottom electrode.

16. The system of claim 9, wherein the first HfO$_2$ layer is doped using a dopant species selected from a group consisting of silicon (Si), aluminum (Al), yttrium (Y), zirconium (Zr), and/or lanthanum (La).

* * * * *